United States Patent
Tsai et al.

[11] Patent Number: 6,141,275
[45] Date of Patent: Oct. 31, 2000

[54] METHOD OF AND APPARATUS FOR PRECHARGING AND EQUALIZING LOCAL INPUT/OUTPUT SIGNAL LINES WITHIN A MEMORY CIRCUIT

[75] Inventors: Terry T. Tsai, San Jose; Daniel F. McLaughlin, Santa Clara, both of Calif.

[73] Assignee: Genesis Semiconductor, San Jose, Calif.

[21] Appl. No.: 09/357,739

[22] Filed: Jul. 20, 1999

Related U.S. Application Data

[60] Provisional application No. 60/127,982, Apr. 6, 1999.
[51] Int. Cl.$^7$ ..................................................... G11C 7/00
[52] U.S. Cl. .................. 365/203; 365/189.09; 365/229
[58] Field of Search .................... 365/203, 229, 365/189.09, 226

[56] References Cited

U.S. PATENT DOCUMENTS

| | | | |
|---|---|---|---|
| 5,297,089 | 3/1994 | Wong | 365/202 |
| 5,485,426 | 1/1996 | Lee et al. | 365/203 |
| 5,696,722 | 12/1997 | Yamauchi | 365/189.11 |
| 5,812,473 | 9/1998 | Tsai | 365/205 |
| 5,877,990 | 3/1999 | Kim | 365/189.05 |
| 5,995,431 | 11/1999 | Inui et al. | 365/203 |
| 6,011,738 | 1/2000 | Son et al. | 365/207 |

*Primary Examiner*—Richard Elms
*Assistant Examiner*—Hien Nguyen
*Attorney, Agent, or Firm*—Haverstock & Owens LLP

[57] ABSTRACT

An equalization and precharge circuit precharges and equalizes local input/output (LIO) signal lines between each memory access operation within a memory circuit. The equalization and precharge circuit includes a local voltage circuit which maintains the level of the LIO signal lines at a standby voltage level during standby periods. Preferably, the standby voltage level is approximately equal to half of the supply voltage VCC. Separate precharge and equalization circuits are included to precharge and equalize the LIO signal lines between memory access operations. During precharge periods, a precharge control signal LIOPC is preferably at a logical high voltage level for a predetermined period of time between memory access operations, thereby forming a fixed-width pulse and raising the LIO signals to a known precharge level. The LIO signal lines are charged to a known level equal to the standby voltage level plus a voltage V(t) during the precharge and equalization period. The voltage V(t) is dependent on the duration of the fixed-width pulse of the precharge control signal LIOPC.

26 Claims, 3 Drawing Sheets

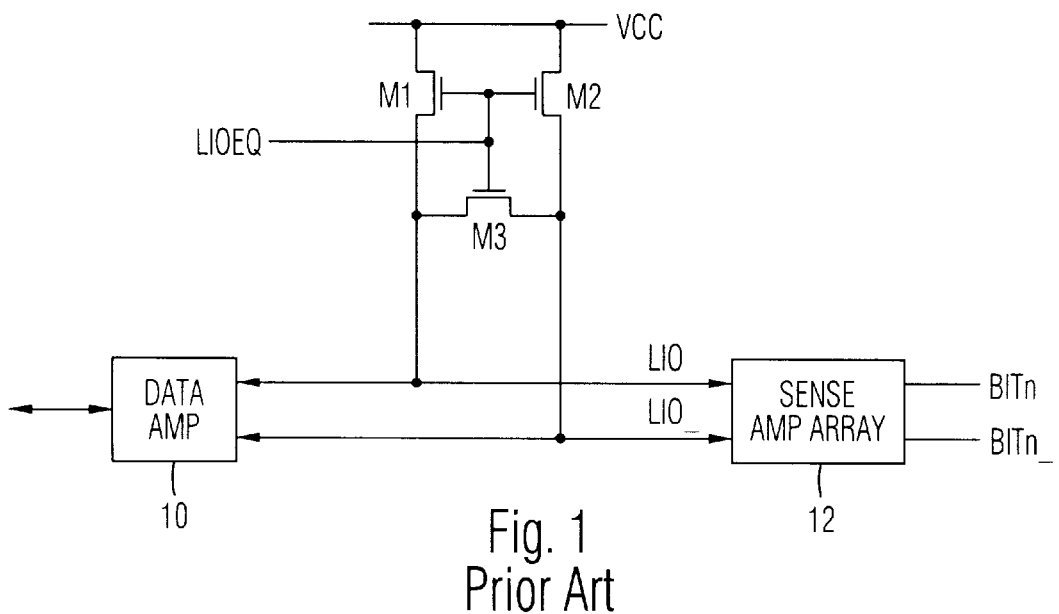
Fig. 1
Prior Art
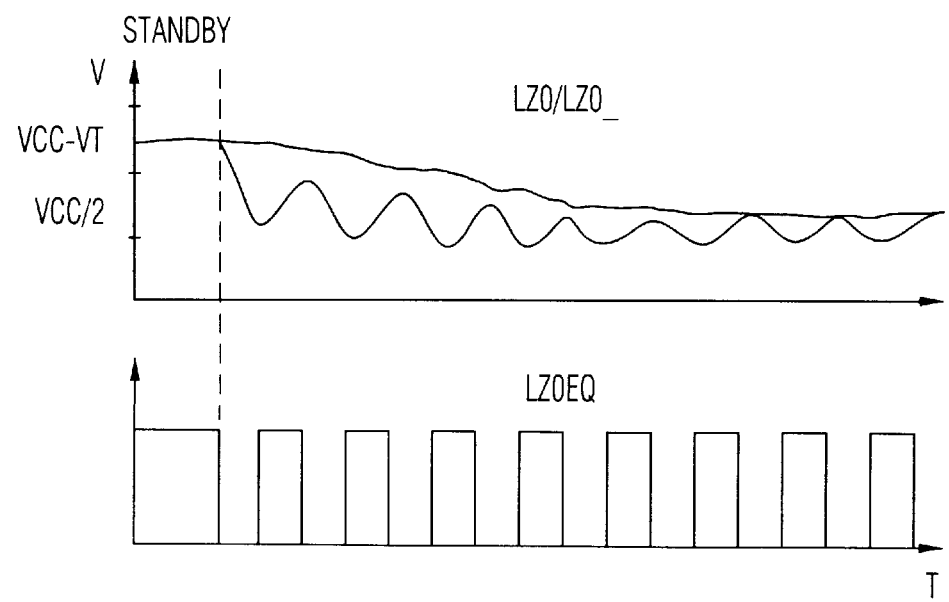
Fig. 2A
Prior Art
Fig. 2B
Prior Art

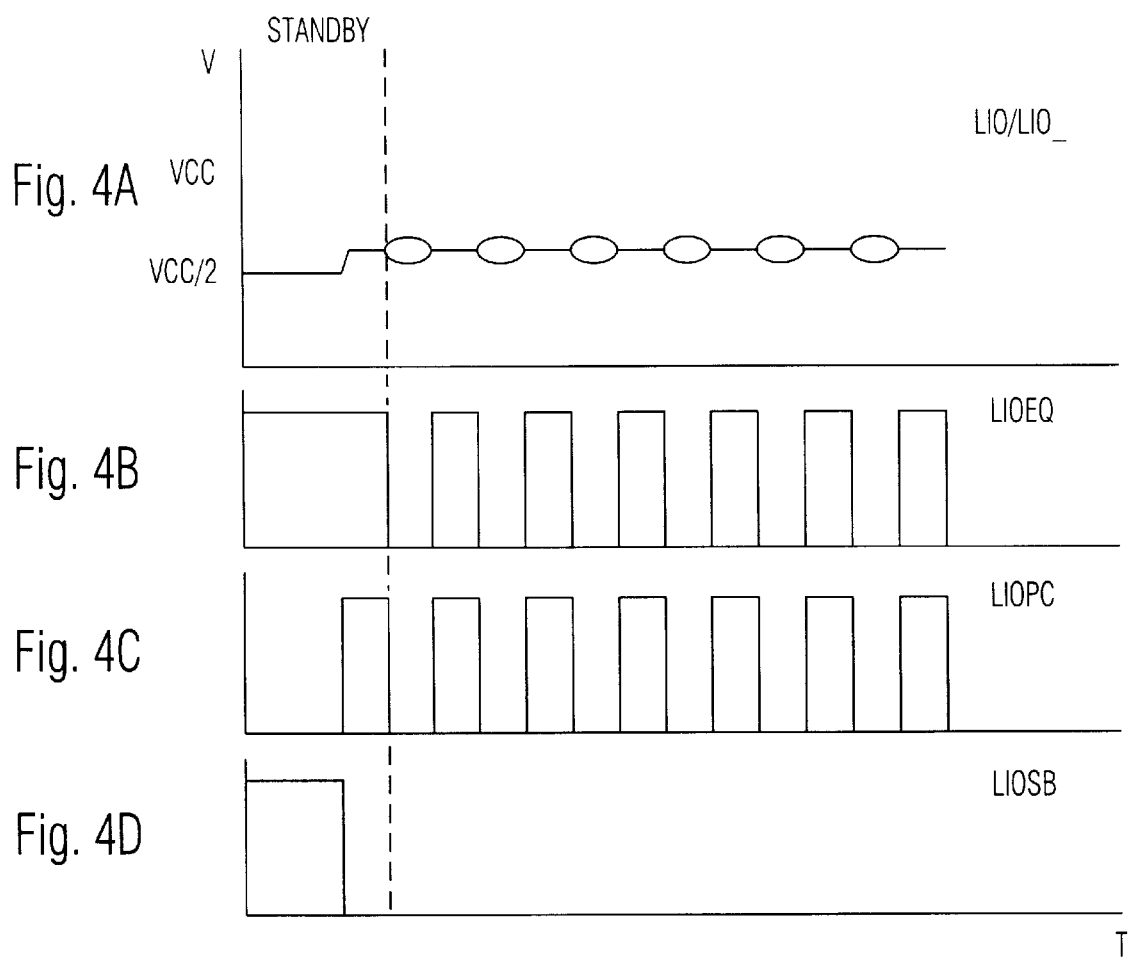

METHOD OF AND APPARATUS FOR PRECHARGING AND EQUALIZING LOCAL INPUT/OUTPUT SIGNAL LINES WITHIN A MEMORY CIRCUIT

RELATED APPLICATIONS

This application claims priority under 35 U.S.C. § 119(e) of the co-pending U.S. provisional application Ser. No. 60/127,982 filed on Apr. 6, 1999 and entitled "METHOD OF AND APPARATUS FOR PRECHARGING AND EQUALIZING LOCAL INPUT/OUTPUT SIGNAL LINES WITHIN A MEMORY CIRCUIT." The provisional application Ser. No. 60/127,982 filed on Apr. 6, 1999 and entitled "METHOD OF AND APPARATUS FOR PRECHARGING AND EQUALIZING LOCAL INPUT/OUTPUT SIGNAL LINES WITHIN A MEMORY CIRCUIT" is also hereby incorporated by reference.

FIELD OF THE INVENTION

The present invention relates to the field of memory circuits. More particularly, the present invention relates to the field of precharging and equalizing signal lines within a memory circuit.

BACKGROUND OF THE INVENTION

Random access memory (RAM) is a component used within electronic systems to store data for use by other components within the system. Dynamic RAM (DRAM) is a type of RAM which uses a capacitor-type storage and requires periodic refreshing in order to maintain the data stored within the DRAM. Static RAM (SRAM) is another type of RAM which retains the information stored within the SRAM as long as power is applied. SRAM does not require periodic refreshing in order to maintain the stored data.

RAM is generally organized within the system into addressable blocks, each containing a predetermined number of memory cells. Each memory cell within a RAM represents a bit of information. The memory cells are organized into rows and columns. Each row of memory cells forms a word. Each memory cell within a row is coupled to the same wordline which is used to activate the memory cells within the row. The memory cells within each column of a block of memory are also each coupled to a pair of bitlines. These bitlines are also coupled to local input/output (LIO) lines. These local input/output lines are used to read data from an activated memory array or write data to an activated memory array. The pair of bitlines includes a bitline and an inverse bitline. A memory cell is therefore accessed by activating the appropriate wordline and pair of bitlines.

Synchronous DRAM (SDRAM) operates within a synchronous memory system such that input and output signals are synchronized to an active edge of a system clock. Most SDRAMs are capable of synchronously providing burst data in a burst mode at a high-speed data rate by automatically generating a column address for storing data within and retrieving data from the SDRAM. Any data within this write burst sequence can be masked by the system so that it is not written into the device. The masking function is typically controlled by a mask control signal which is usually provided to the SDRAM through a dedicated pin.

Generally, before a memory access operation is performed to or from a memory cell within a block of memory, the pairs of bitlines or LIO signal lines within that block of memory are all precharged to a specified voltage level. A memory access operation includes both write and read operations. The precharge operation equalizes the voltage level of the bitlines at a known level, to enhance reliability of the data written to a cell and to allow quick detection of data read from a cell. Because the same pair of LIO signal lines is used for all memory cells within a column, if the bitlines are not precharged or equalized before each memory operation, then a second access to a memory cell within the column would require that the LIO signal lines are first equalized from their previous voltage level to a known voltage level and then brought to the appropriate logical voltage level. Accordingly, in order to speed up the performance of the memory, the LIO signal lines within a block of memory are typically all precharged to the specified known voltage level after each memory operation, in anticipation of the next memory operation. This allows the LIO signal lines to be reliably brought to the appropriate logical voltage level faster during the memory operation.

Relevant portions of an SDRAM circuit which implement an equalization and precharge circuit for a pair of LIO signal lines in a conventional manner are illustrated in FIG. 1. This equalization and precharge circuit includes three transistors M1, M2 and M3. The drains of the transistors M1 and M2 are both coupled to the supply voltage VCC. The source of the transistor M1 is coupled to the drain of the transistor M3 and to the signal line LIO. The source of the transistor M2 is coupled to the source of the transistor M3 and to the signal line LIO_. The gates of the transistors M1, M2 and M3 are all coupled together and to an equalization control signal line LIOEQ. In this memory circuit, the equalization control signal line LIOEQ is at a logical high voltage level during standby cycles and during precharge cycles between memory access operations. At all other times, the equalization control signal line LIOEQ is at a logical low voltage level.

During read and write operations, the signal line LIO carries a logical value representing the data read from or to be written to the addressed memory cell. During read and write operations, the signal line LIO_ carries a logical value representing the inverse of the data on the signal line LIO. The signal lines LIO and LIO_ are coupled to a data amplifier 10 and to a sense amplifier array 12. The sense amplifier 12 is coupled to bitlines Bitn and Bitn_. The bitline Bitn_ carries a logical value representing the inverse of the data on the bitline Bitn. During a read operation, the data from the addressed memory cell is latched into the sense amplifier 12. This latched data is also represented on the signal lines LIO and LIO_. The data amplifier 10 then amplifies the change in the signal lines LIO and LIO_ during a read operation, from the precharge level to a level representing the data being read from the addressed memory cell. In the case of a write operation, the sense amplifier 12 determines the appropriate sense of the data on the signal lines LIO and LIO_, during the write operation and transmits this data to the bitlines Bitn and Bitn_ of the selected sense amplifier.

Timing diagrams illustrating the operation of the equalization and precharge circuit of FIG. 1 are illustrated in FIG. 2. Waveforms representing the values of the signal lines LIO and LIO_ are illustrated in FIG. 2A. A waveform representing the value of the equalization control signal line LIOEQ is illustrated in FIG. 2B. As shown in FIG. 2B, the equalization control signal line LIOEQ is at a logical high voltage level during the initial standby cycle. During this standby cycle, when the equalization control signal line LIOEQ is at a logical high voltage level, the transistors M1, M2 and M3 are all turned on and the signal lines LIO and LIO__ are both precharged to a voltage level equal to the level of the supply voltage VCC less the transistor threshold voltage VT.

During the first and subsequent memory access operations, the value of the signal lines LIO and LIO__ then diverge from the precharged level, based on the data being read from or written to the addressed memory cell during the memory operation. After the first and subsequent memory access operations, the equalization control signal line LIOEQ is then raised to a logical high voltage level to turn on the transistors M1, M2 and M3 and precharge and equalize the values of the signal lines LIO and LIO__ before the next memory access operation. However, as illustrated in FIG. 2, during a typical precharge operation in a high-speed memory, the precharge cycle is not of a duration that is long enough to precharge the values of the signal lines LIO and LIO__ to a level equal to VCC-VT. As illustrated in FIG. 2A, because of the limited duration of the precharge cycle in high-speed memory devices, the precharged level of the signal lines LIO and LIO__ will degrade over time from the initial level of VCC-VT. This degradation can cause problems in the operation of the data amplifier 10, which is typically optimized to operate within a limited range of voltage levels. Operating outside of this optimal range will cause delays in the operation of the data amplifier 10.

As also illustrated in FIG. 2A, after the first few memory access operations, due to the limited duration of the precharge cycles, the signal lines LIO and LIO__ are not fully equalized before each memory access operation. This equalization level does not become acceptable until the precharge level of the signals LIO and LIO__ degrades to a level approaching half of the supply voltage VCC. Once the precharge level degrades to this level, the equalization and precharge circuit, as illustrated in FIG. 1, is able to equalize the signal lines LIO and LIO__ to this level during the precharge cycles. However, the non-equalization of the signal lines LIO and LIO__ during the early precharge cycles can cause functionality problems during the early memory access operations.

SUMMARY OF THE INVENTION

An equalization and precharge circuit precharges and equalizes local input/output (LIO) signal lines between each memory access operation within a memory circuit. The equalization and precharge circuit includes a local voltage circuit which maintains the level of the LIO signal lines at a standby voltage level during standby periods. Preferably, the standby voltage level is approximately equal to half of the supply voltage VCC. Separate precharge and equalization circuits are included to precharge and equalize the LIO signal lines between memory access operations. During precharge periods, a precharge control signal LIOPC is preferably at a logical high voltage level for a predetermined period of time between memory access operations, thereby forming a fixed-width pulse and raising the LIO signals to a known precharge level. The LIO signal lines are charged to a known level equal to the standby voltage level plus a voltage V(t) during the precharge and equalization period. The voltage V(t) is dependent on the duration of the fixed-width pulse of the precharge control signal LIOPC.

According to one aspect of the present invention, a method of precharging one or more signal lines within a memory circuit includes the steps of maintaining the signal lines at a standby voltage level during a standby period, wherein the standby voltage level is less than a supply voltage level and precharging the signal lines to a precharge level which is greater than the standby voltage level and less than the supply voltage level before each memory access operation to the memory circuit. This method further includes the step of equalizing the signal lines to the precharge level before each memory access operation to the memory circuit. The standby voltage level is preferably approximately equal to half of the supply voltage level. The step of precharging is performed for a fixed duration of time.

According to another aspect of the present invention, an apparatus for precharging one or more signal lines within a memory circuit includes one or more signal lines used to read from and write to the memory circuit, a standby circuit coupled to the signal lines for maintaining the signal lines at a standby voltage level during a standby period, wherein the standby voltage level is less than a supply level of a supply voltage and a precharging circuit coupled to the signal lines for precharging the signal lines to a precharge level before each memory access operation to the memory circuit, wherein the precharge level is greater than the standby voltage level and less than the supply level. The standby circuit and the precharging circuit are both further coupled to receive the supply voltage. The apparatus further includes an equalizing circuit coupled to the signal line for equalizing the signal lines at the precharge level before each memory access operation to the memory circuit. The standby voltage level is preferably approximately equal to half of the supply level. The precharging circuit is further coupled to receive a precharge control signal having a fixed width pulse, wherein the precharging circuit operates in response to the precharge control signal. The standby circuit is further coupled to receive a standby control signal and the equalizing circuit is further coupled to receive an equalization control signal.

According to yet another aspect of the present invention, a memory circuit includes a plurality of memory cells organized into a plurality of rows and a plurality of columns, a plurality of pairs of signal lines, wherein each memory cell has a corresponding pair of signal lines, a standby circuit coupled to the signal lines for maintaining the signal lines at a standby voltage level during a standby period, wherein the standby voltage level is less than a supply level of a supply voltage and a precharging circuit coupled to the signal lines for precharging the signal lines to a precharge level before each memory access operation, wherein the precharge level is greater than the standby voltage level and less than the supply level. The memory circuit further includes an equalizing circuit coupled to the signal lines for equalizing the signal lines at the precharge level before each memory access operation to the memory circuit. The standby voltage level is preferably approximately equal to half of the supply level. The precharging circuit is further coupled to receive a precharge control signal having a fixed width pulse, wherein the precharging circuit operates in response to the precharge control signal. The standby circuit is further coupled to receive a standby control signal and the equalizing circuit is further coupled to receive an equalization control signal. The standby circuit and the precharging circuit are both further coupled to receive the supply voltage. The standby circuit includes a voltage generation circuit. The voltage generation circuit preferably includes a voltage divider circuit having a first resistor and a second resistor both of equal value. The signal lines are preferably local input/output signal lines. The memory circuit is preferably an SDRAM circuit. Alternatively, the memory circuit can be any other type of memory circuit including SRAM, DRRAM or DDRAM.

According to yet another aspect of the present invention, a memory circuit includes a plurality of memory cells organized into a plurality of rows and a plurality of columns, a plurality of pairs of signal lines, wherein each memory cell has a corresponding pair of signal lines, a standby circuit coupled to the signal lines and to receive a supply voltage and including a voltage divider circuit for maintaining the signal lines at a standby voltage level during a standby period, wherein the standby voltage level is less than a supply level of the supply voltage, a precharging circuit coupled to the signal lines and to receive the supply voltage for precharging the signal lines to a precharge level before each memory access operation, wherein the precharge level is greater than the standby voltage level and less than the supply level and an equalizing circuit coupled to the signal lines for equalizing the signal lines at the precharge level before each memory access operation. The precharging circuit is further coupled to receive a precharge control signal having a fixed width pulse, wherein the precharging circuit operates in response to the precharge control signal. The standby voltage level is preferably approximately equal to half of the supply voltage level.

BRIEF DESCRIPTION OF THE DRAWINGS

FIG. 1 illustrates a schematic diagram of an equalization and precharge circuit within an SDRAM of the prior art.

FIGS. 2A and 2B illustrate waveforms of the signal lines LIO, LIO_ and LIOEQ during operation of the equalization and precharge circuit of FIG. 1.

FIGS. 4A, 4B, 4C and 4D illustrate waveforms of the signal lines LIO, LIO_, LIOEQ, LIOPC and LIOSB during operation of the equalization and precharge circuit of FIG. 3.

DETAILED DESCRIPTION OF THE PREFERRED EMBODIMENT

Figure 3:
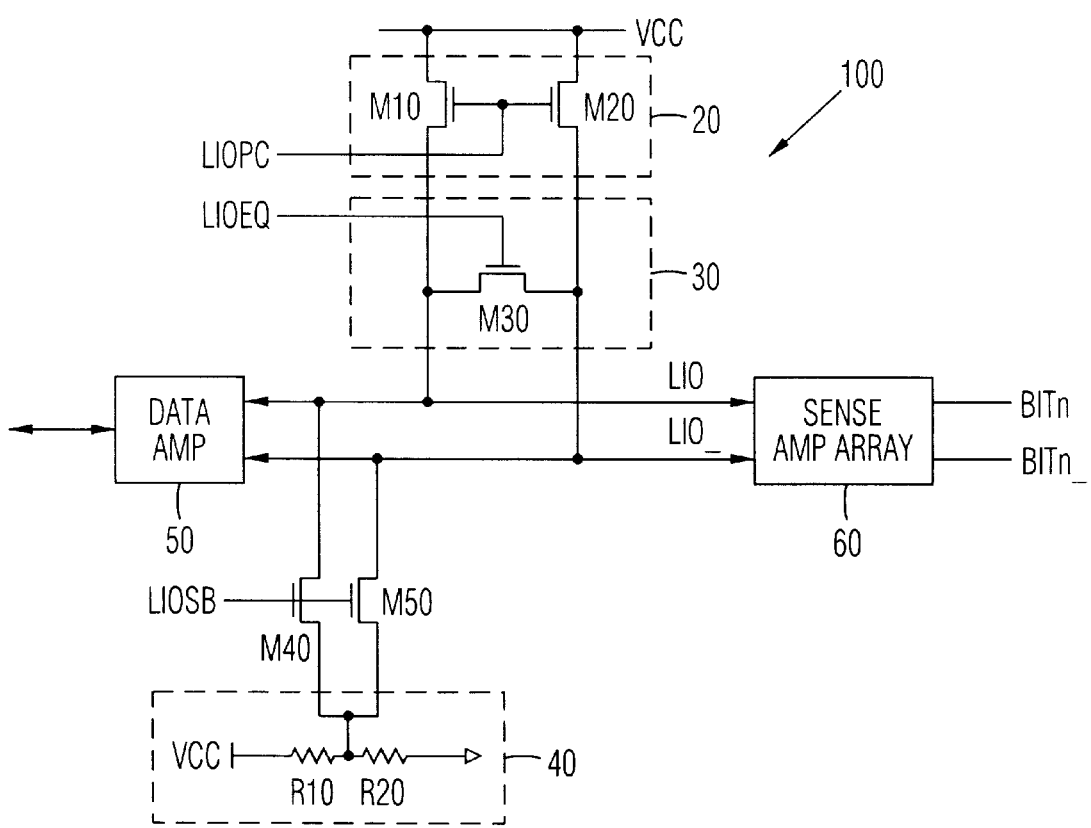
FIG. 3 illustrates a schematic diagram of an equalization and precharge circuit within an SDRAM according to the preferred embodiment of the present invention.

The equalization and precharge circuit of the present invention includes a local voltage generation circuit which maintains the level of the signal lines LIO and LIO_ at a standby voltage level during standby modes. Preferably, the standby voltage level is approximately equal to half of the supply voltage VCC. A standby control signal LIOSB controls the voltage generation circuit and is used to maintain the signal lines LIO and LIO_ at the standby voltage level during the standby periods. A separate precharge circuit and equalization circuit are included to precharge and equalize the signal lines LIO and LIO_ between memory access operations. The precharge circuit is controlled by a precharge control signal LIOPC and the equalization circuit is controlled by an equalization control signal LIOEQ. During precharge cycles, the precharge control signal LIOPC is preferably at a logical high voltage level for a predetermined time period. Because the precharge control signal LIOPC is a fixed-width pulse, the signal lines LIO and LIO_ are charged to a known level equal to the standby voltage level plus a voltage V(t). The voltage V(t) is a function of the size of the transistors within the precharge circuit and the duration of the precharge control signal LIOPC pulse. During equalization, the equalization control signal LIOEQ is preferably at a logical high voltage level for a predetermined time period. Because the signal lines LIO and LIO_ are operating near the standby voltage level, the time necessary to equalize the levels of the signal lines LIO and LIO_ is relatively short, as compared to precharge and equalization circuits of the prior art, as illustrated in FIG. 1 and discussed above. Accordingly, between each memory access operation, the signal lines LIO and LIO_ are both charged up to the precharge level, even during early memory access operations. This allows the data amplifier to operate efficiently in a more optimal range.

Relevant portions of a memory circuit which implements the equalization and precharge circuit of the preferred embodiment of the present invention are illustrated in FIG. 3. For simplicity of explanation, only the relevant portions of the memory circuit of the preferred embodiment of the present invention are illustrated in FIG. 3. It will however be apparent to those skilled in the art that the memory circuit illustrated in FIG. 3, includes many other conventional components including arrays of memory cells and corresponding circuitry. The equalization and precharge circuit 100 includes a precharge circuit 20, an equalization circuit 30 and a voltage generation circuit 40. The precharge circuit 20 includes transistors M10 and M20. The drains of the transistors M10 and M20 are both coupled to the supply voltage VCC. The gates of the transistors M10 and M20 are both coupled to the precharge control signal LIOPC. The equalization circuit 30 includes the transistor M30. The source of the transistor M10 is coupled to the drain of the transistor M30 and to the signal line LIO. The source of the transistor M20 is coupled to the source of the transistor M30 and to the signal line LIO_. The signal lines LIO and LIO_ are both coupled to the data amplifier 50 and the sense amplifier array 60. As described above, the signal line LIO carries a logical value representing the data read from or to be written to the addressed memory cell during memory access operations. The signal line LIO_ carries a logical value representing the inverse of the data on the signal LIO, during memory access operations. The sense amplifier 60 is coupled to bitlines Bitn and Bitn_. The bitline Bitn_ carries a logical value representing the inverse of the data on the bitline Bitn. During a read operation, the data from the addressed memory cell is latched into the sense amplifier 60. This latched data is also represented on the signal lines LIO and LIO_. The data amplifier 50 then amplifies the change in the signal lines LIO and LIO_ during a read operation, from the precharge level to a level representing the data being read from the addressed memory cell. During a write operation, the sense amplifier 60 determines the appropriate sense of the data on the signal lines LIO and LIO_ during the write operation and transmits this data to the bitlines Bitn and Bitn_ of the selected sense amplifier.

The source of the transistor M40 is coupled to the signal line LIO. The source of the transistor M50 is coupled to the signal line LIO_. The gates of the transistors M40 and M50 are both coupled to the standby control signal LIOSB. The drains of the transistors M40 and M50 are coupled together, to a first terminal of the resistor R10 and to a first terminal of the resistor R20. The second terminal of the resistor R10 is coupled to the supply voltage VCC. The second terminal of the resistor R20 is coupled to ground. The local voltage circuit 40 preferably includes a voltage divider formed by the resistors R10 and R20. The node formed by the first terminals of the resistors R10 and R20 provides a standby voltage level. Preferably, the resistors R10 and R20 are of an equal value so that the standby voltage level at the first terminal of the resistors R10 and R20 is approximately equal to half of the supply voltage VCC.

When the memory circuit is in a standby period, the standby control signal LIOSB is preferably at a logical high voltage level. During the standby period, when the standby control signal LIOSB is at a logical high voltage level, the transistors M40 and M50 are both turned on and the signal lines LIO and LIO_ are maintained at a level equal to the standby voltage level. During non-standby periods, the standby control signal LIOSB is at a logical low voltage level, the transistors M40 and M50 are turned off and the signal lines LIO and LIO__ are controlled by the precharge circuit 20 and the equalization circuit 30 during precharge periods and by other circuits within the memory array during read and write memory access operations.

Between memory access operations of the memory array, during precharge periods, the precharge control signal LIOPC is preferably at a logical high voltage level for a predetermined period of time. When the precharge control signal LIOPC is at a logical high voltage level, the transistors M10 and M20 are turned on and the signal lines LIO and LIO__ are charged up before each memory access operation. Also, between memory access operations, the equalization control signal LIOEQ is preferably at a logical high voltage level for a predetermined period of time. When the equalization control signal LIOEQ is at a logical high voltage level, the transistor M30 is turned on and the signal lines LIO and LIO__ are equalized by charge sharing between the signal lines LIO and LIO__.

During precharge periods, the precharge control signal line LIOPC is at a logical high voltage level for a predetermined period of time. Because the precharge control signal line LIOPC is a fixed-width pulse, the signal lines LIO and LIO__ are precharged to a level equal to the standby voltage level plus a voltage V(t), during each precharge period. The voltage precharge control signal line LIOPC pulse. Due to the fixed-width pulse of the precharge control signal line LIOPC and because the signal lines LIO and LIO__ preferably start near a level equal to the standby voltage level, variations in the precharge levels of the signal lines LIO and LIO__ are minimized.

Timing diagrams illustrating the operation of the equalization and precharge circuit of the present invention, as illustrated in FIG. 3, are illustrated in FIG. 4. Waveforms representing the values of the signal lines LIO and LIO__ are illustrated in FIG. 4A. A waveform representing the value of the equalization control signal line LIOEQ is illustrated in FIG. 4B. A waveform representing the value of the precharge control signal line LIOPC is illustrated in FIG. 4C. A waveform representing the value of the standby control signal line LIOSB is illustrated in FIG. 4D.

As shown in FIG. 4D, the standby control signal line LIOSB is at a logical high voltage level during the initial standby cycle, turning on the transistors M40 and M50 and maintaining the level of the signal lines LIO and LIO__, illustrated in FIG. 4A, at the standby voltage level. Preferably, the standby voltage level is approximately equal to half of the supply voltage VCC. Also during this initial standby cycle, the equalization control signal line LIOEQ is at a logical high voltage level, turning on the transistor M30 and maintaining the signal lines LIO and LIO__ at an equalized level. At the end of the standby cycle, during the first precharge period, when the memory circuit is preparing for the first memory access operation, the precharge control signal line LIOPC is raised to a logical high voltage level and the standby control signal line LIOSB is pulled to a logical low voltage level. When the precharge control signal LIOPC is raised to a logical high voltage level, the transistors M10 and M20 are turned on and the signal lines LIO and LIO__ are raised to a level above the standby voltage level. As discussed above, during each precharge period, the signal lines LIO and LIO__ are raised to a level equal to the standby voltage level plus a voltage V(t), where the voltage V(t) is dependent on the duration of the precharge period. At the end of the precharge period, when the signal lines LIO and LIO__ are at the precharge level equal to the standby voltage level plus the voltage V(t), the precharge control signal line LIOPC and the equalization control signal line LIOEQ are both pulled down to a logical low voltage level, turning off the transistors M10, M20 and M30.

During the first and subsequent memory access operations, the value of the signal lines LIO and LIO__ then diverge from the precharge level, based on the data being read from or written to the memory during the memory operation. After the first and subsequent memory access operations, the equalization control signal line LIOEQ and the precharge control signal line LIOPC, are both raised to a logical high voltage level, during the precharge periods, and the signal lines LIO and LIO__ are both charged to the precharge level. As discussed above, during standby periods, the standby control signal LIOSB is raised to a logical high voltage level and the signal lines LIO and LIO__ are maintained at the standby voltage level.

Between memory access operations, the precharge control signal LIOPC is raised to a logical high voltage level for a fixed duration of time. This allows the signal lines LIO and LIO__ to be charged to a known level equal to the standby voltage level plus the voltage V(t). Also, the equalization control signal LIOEQ is at a logical high voltage level for a fixed duration of time. Because the signal lines LIO and LIO__ are operating near a level equal to the standby voltage level, the signal lines LIO and LIO__ are equalized in a relatively short period of time. Accordingly, between each memory access operation, the signal lines LIO and LIO__ are both charged up to and equalized at the known precharge level. The signal lines LIO and LIO__ are therefore precharged to the known precharge level before each memory access operation, allowing the data amplifier to operate efficiently in an optimal range.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, while the preferred embodiment of the present invention is implemented within an SDRAM memory circuit, it will be apparent to those skilled in the art that the teachings of the present invention can be readily implemented within any other appropriate type of memory circuit.

We claim:

1. A method of precharging one or more signal lines within a memory circuit comprising the steps of:

a. maintaining the signal lines at a standby voltage level during a standby period, wherein the standby voltage level is less than a supply voltage level; and b. precharging the signal lines to a precharge level which is greater than the standby voltage level and less than the supply voltage level before each memory access operation to the memory circuit.

2. The method as claimed in claim 1 further comprising the step of equalizing the signal lines to the precharge level before each memory access operation to the memory circuit.

3. The method as claimed in claim 2 wherein the standby voltage level is approximately equal to half of the supply voltage level.

4. The method as claimed in claim 1 wherein the step of precharging is performed for a fixed duration of time.

5. An apparatus for precharging one or more signal lines within a memory circuit comprising:

a. one or more signal lines used to read from and write to the memory circuit;

b. a standby circuit coupled to the signal lines for maintaining the signal lines at a standby voltage level during a standby period, wherein the standby voltage level is less than a supply level of a supply voltage; and c. a precharging circuit coupled to the signal lines for precharging the signal lines to a precharge level before each memory access operation to the memory circuit, wherein the precharge level is greater than the standby voltage level and less than the supply level.

6. The apparatus as claimed in claim 5 wherein the standby circuit and the precharging circuit are both further coupled to receive the supply voltage.

7. The apparatus as claimed in claim 5 further comprising an equalizing circuit coupled to the signal line for equalizing the signal lines at the precharge level before each memory access operation to the memory circuit.

8. The apparatus as claimed in claim 7 wherein the standby voltage level is approximately equal to half of the supply level.

9. The apparatus as claimed in claim 8 wherein the precharging circuit is further coupled to receive a precharge control signal having a fixed width pulse, wherein the precharging circuit operates in response to the precharge control signal.

10. The apparatus as claimed in claim 9 wherein the standby circuit is further coupled to receive a standby control signal and the equalizing circuit is further coupled to receive an equalization control signal.

11. A memory circuit comprising:

a. a plurality of memory cells organized into a plurality of rows and a plurality of columns;

b. a plurality of pairs of signal lines, wherein each memory cell has a corresponding pair of signal lines;

c. a standby circuit coupled to the signal lines for maintaining the signal lines at a standby voltage level during a standby period, wherein the standby voltage level is less than a supply level of a supply voltage; and d. a precharging circuit coupled to the signal lines for precharging the signal lines to a precharge level before each memory access operation, wherein the precharge level is greater than the standby voltage level and less than the supply level.

12. The memory circuit as claimed in claim 11 further comprising an equalizing circuit coupled to the signal lines for equalizing the signal lines at the precharge level before each memory access operation to the memory circuit.

13. The memory circuit as claimed in claim 12 wherein the standby voltage level is approximately equal to half of the supply level.

14. The memory circuit as claimed in claim 13 wherein the precharging circuit is further coupled to receive a precharge control signal having a fixed width pulse, wherein the precharging circuit operates in response to the precharge control signal.

15. The memory circuit as claimed in claim 14 wherein the standby circuit is further coupled to receive a standby control signal and the equalizing circuit is further coupled to receive an equalization control signal.

16. The memory circuit as claimed in claim 15 wherein the standby circuit and the precharging circuit are both further coupled to receive the supply voltage.

17. The memory circuit as claimed in claim 16 wherein the standby circuit includes a voltage generation circuit.

18. The memory circuit as claimed in claim 17 wherein the voltage generation circuit includes a voltage divider circuit having a first resistor and a second resistor both of equal value.

19. The memory circuit as claimed in claim 17 wherein the signal lines are local input/output signal lines.

20. The memory circuit as claimed in claim 19 wherein the memory circuit is an SDRAM circuit.

21. The memory circuit as claimed in claim 19 wherein the memory circuit is an SRAM circuit.

22. The memory circuit as claimed in claim 19 wherein the memory circuit is a DRRAM circuit.

23. The memory circuit as claimed in claim 19 wherein the memory circuit is a DDRAM circuit.

24. A memory circuit comprising:

a. a plurality of memory cells organized into a plurality of rows and a plurality of columns;

b. a plurality of pairs of signal lines, wherein each memory cell has a corresponding pair of signal lines;

c. a standby circuit coupled to the signal lines and to receive a supply voltage and including a voltage divider circuit for maintaining the signal lines at a standby voltage level during a standby period, wherein the standby voltage level is less than a supply level of the supply voltage;

d. a precharging circuit coupled to the signal lines and to receive the supply voltage for precharging the signal lines to a precharge level before each memory access operation, wherein the precharge level is greater than the standby voltage level and less than the supply level; and e. an equalizing circuit coupled to the signal lines for equalizing the signal lines at the precharge level before each memory access operation.

25. The memory circuit as claimed in claim 24 wherein the precharging circuit is further coupled to receive a precharge control signal having a fixed width pulse, wherein the precharging circuit operates in response to the precharge control signal.

26. The memory circuit as claimed in claim 25 wherein the standby voltage level is approximately equal to half of the supply voltage level.

* * * * *

UNITED STATES PATENT AND TRADEMARK OFFICE
CERTIFICATE OF CORRECTION

PATENT NO. : 6,141,275
DATED : October 31, 2000
INVENTOR(S) : Terry T. Tsai et al.

It is certified that error appears in the above-identified patent and that said Letters Patent is hereby corrected as shown below:

Column 7,
Line 26, after "voltage", please insert -- V(t) is a function of the size of the transistors M10 and M20 and the duration of the --.

Signed and Sealed this

Eleventh Day of December, 2001

*Attest:*

Nicholas P. Godici

NICHOLAS P. GODICI
*Attesting Officer*    *Acting Director of the United States Patent and Trademark Office*